US010862485B1

(12) United States Patent
Jarboe

(10) Patent No.: US 10,862,485 B1
(45) Date of Patent: Dec. 8, 2020

(54) LOOKUP TABLE INDEX FOR A PROCESSOR

(71) Applicants: VeriSilicon Microelectronics (Shanghai) Co., Ltd., Shanghai (CN); VeriSilicon Holdings Co., Ltd., Grand Cayman (KY)

(72) Inventor: Steve Jarboe, Carrollton, TX (US)

(73) Assignees: VeriSilicon Microelectronics (Shanghai) Co., Ltd., Shanghai (CN); VeriSilicon Holdings Co., Ltd., Plano, TX (US)

( * ) Notice: Subject to any disclaimer, the term of this patent is extended or adjusted under 35 U.S.C. 154(b) by 157 days.

(21) Appl. No.: 16/116,553

(22) Filed: Aug. 29, 2018

(51) Int. Cl.
G06F 9/30 (2018.01)
H03K 19/17728 (2020.01)
G06F 15/80 (2006.01)
G06F 9/38 (2018.01)

(52) U.S. Cl.
CPC ..... *H03K 19/17728* (2013.01); *G06F 9/3004* (2013.01); *G06F 9/30036* (2013.01); *G06F 9/30098* (2013.01); *G06F 9/3853* (2013.01); *G06F 15/8053* (2013.01)

(58) Field of Classification Search
None
See application file for complete search history.

(56) References Cited

U.S. PATENT DOCUMENTS

| 6,384,750 | B1* | 5/2002 | Brown | H04L 12/4641 |
| | | | | 341/106 |
| 6,397,324 | B1* | 5/2002 | Barry | G06F 9/3004 |
| | | | | 711/149 |
| 2006/0059196 | A1* | 3/2006 | Sato | H04L 45/54 |
| 2011/0157465 | A1* | 6/2011 | Lin | H04N 7/088 |
| | | | | 348/448 |
| 2011/0314355 | A1* | 12/2011 | Grube | H03M 13/3761 |
| | | | | 714/763 |
| 2012/0131309 | A1* | 5/2012 | Johnson | G06F 9/30 |
| | | | | 712/41 |
| 2012/0331088 | A1* | 12/2012 | O'Hare | G06F 21/6227 |
| | | | | 709/214 |
| 2017/0193676 | A1* | 7/2017 | Bhattacharjee | G06T 11/001 |
| 2019/0026491 | A1* | 1/2019 | Telford | G06F 21/6227 |

OTHER PUBLICATIONS

"ARM NEON: How to implement a 256bytes Look Up table"; https://stackoverflow.com/questions/22158186/arm-neon-low-to-implement-a-256byest-look-up-table; Mar. 3, 2014; 2 pgs.
"ARM Compiler armcc User Guide"; Version 5.06; ARM DUI0472M; http://infocenter.arm.com/help/index.isp?topic=/com.arm.doc.dui0472m/chr1360928368027.html; Undated; 2 pgs.

* cited by examiner

*Primary Examiner* — Michael Sun

(57) ABSTRACT

The present disclosure is directed to a method of utilizing a lookup table (LUT) where the index to the LUT does not need to be modified or changed in cases where the LUT is larger than a single register or larger than a set of available registers. In another embodiment, a processor instruction is disclosed that can take in one or more indices to a LUT and return the lookup results, without modifying the indices, when the LUT is larger than the available register data element space. In another embodiment, a SIMD processor system is disclosed that can implement a processor instruction to utilize a LUT that is larger than the available register data element space without needing to modify the parameterized index when a different subset of the LUT is swapped into the available registers.

25 Claims, 6 Drawing Sheets

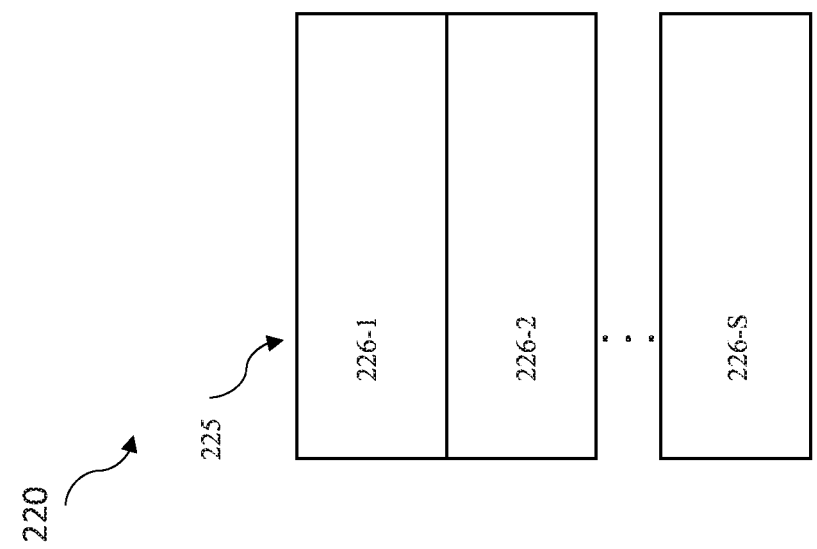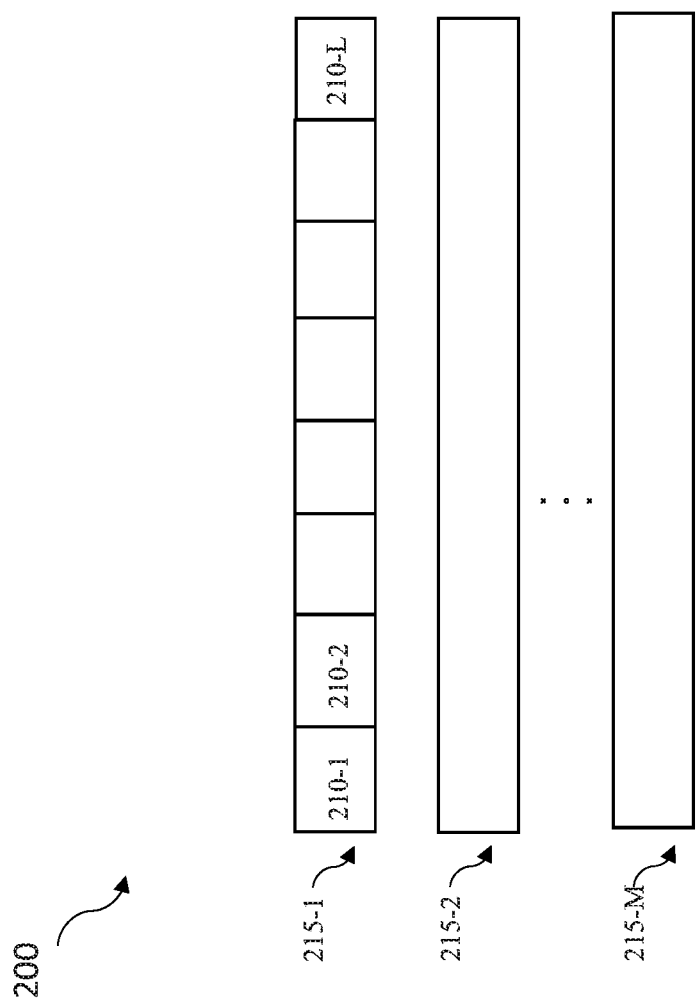

| LUT Entry #, linear | Segment # | LUT register # | Register Element | | | LUT Entry # |
|---|---|---|---|---|---|---|
| 305 | 310 | 315 | 320 | | | 325 |
| 0 | | | 0 | | | 0 |
| 1 | | 0 | 1 | | | 1 |
| ... | 0 | | ... | | | ... |
| | | | L-1 | | | L-1 |
| | | | 0 | | | (M-1)*L |
| | | ... | 1 | | | M*L-1 |
| | | M-1 | ... | | | M*L |
| | | | L-1 | | | (M+1)*L-1 |
| | 1 | 0 | 0 | | | (2*M+1)*L-1 |
| | | | 1 | | | |
| | | | ... | | | 2*M*L-1 |
| | | | L-1 | | | |
| | ... | ... | ... | | | ... |
| | | | 0 | | | (S-1)*M*L-1 |
| | | 0 | 1 | | | |
| | | | ... | | | S*M*L-1 |
| | | | L-1 | | | |
| M-1 | S-1 | M-1 | 0 | | | S*M*L-1 |
| | | | 1 | | | |
| | | | ... | | | |
| | | | L-1 | | | |

LOOKUP TABLE INDEX FOR A PROCESSOR

TECHNICAL FIELD

This application is directed, in general, to a lookup table operation and, more specifically, to a segmented lookup table operation utilizing encoded indices.

BACKGROUND

Lookup table (LUT) operations are a common feature found in many processing chips. When a LUT is small enough to fit into one processing chip with multiple registers or within one register, the process is a simple selection process. Typically, each input lane of the register is an index to the LUT data for one lane of result. If the LUT is too large to fit into the available registers in the processing chip, additional operations can be performed to combine the results from multiple lookups.

For example, the ARM NEON SIMD extension provides a LUT instruction to force the result of each LUT instruction to 0 or leaves the destination unmodified if the index value is larger than the table size being held in the registers. For tables that are larger than can fit in the registers, the index must be repeatedly modified to use as the index to another portion of the LUT.

SUMMARY

The disclosure provides a method to utilize a lookup table (LUT) in a processor. One aspect of the method includes: (1) splitting the LUT into more than one segment, wherein the LUT is larger than a register of the processor, (2) storing a subset of the segments in a set of said registers, (3) comparing an index of a data value and a LUT segment identification (ID) of each of the segments, wherein a subset of bits from the index are decoded to compare with the LUT segment ID, and (4) returning a result, utilizing the comparing.

The disclosure also provides for a computer program product having a series of operating instructions stored on a non-transitory computer-readable medium that directs a data processing apparatus when executed thereby to perform operations utilizing a LUT. One aspect of the computer program product includes: (1) splitting the LUT into more than one segment, wherein the LUT is larger than a register of a processor, (2) storing a subset of the segments in a set of said registers, (3) comparing a decoded subset of bits of an index of a data value and a LUT segment ID of each of the segments, wherein the index is encoded with one or more of register lanes, register ID, and segment ID, and (4) returning a result, utilizing the comparing.

The disclosure also provides for a LUT processing system to perform a LUT operation on a single instruction multiple data (SIMD) processor. One aspect of the system includes: (1) a set of registers, each operable to store a subset of the LUT, (2) a memory, operable to store one or more instructions, the LUT, a segment ID, one or more indices, and instruction parameters, and (3) an execution circuit, operable to execute a set of LUT operation instructions, wherein the instructions load a subset of the LUT segments from the memory into the set of registers, compare a decoded subset of bits from an index of a data value to a LUT segment ID of the loaded subset of the LUT segments, and return an indexed return value utilizing the compare.

The disclosure also provides for a method to utilize a LUT in a computing system. One aspect of the method includes: (1) splitting the LUT into more than one segment, wherein the LUT is larger than the memory access size of a processor of the computing system, (2) comparing a decoded subset of bits of an index of a data value and a LUT segment ID of each of the segments, and (3) returning a result, utilizing the comparing.

BRIEF DESCRIPTION

Reference is now made to the following descriptions taken in conjunction with the accompanying drawings, in which:

FIG. 2A is an illustration of a diagram of an example vector register scheme of a LUT;

FIG. 2B is an illustration of a diagram of an example implementation of a segmented LUT;

FIG. 3 is an illustration of a table demonstrating an example LUT segmentation;

DETAILED DESCRIPTION

Figure 1:
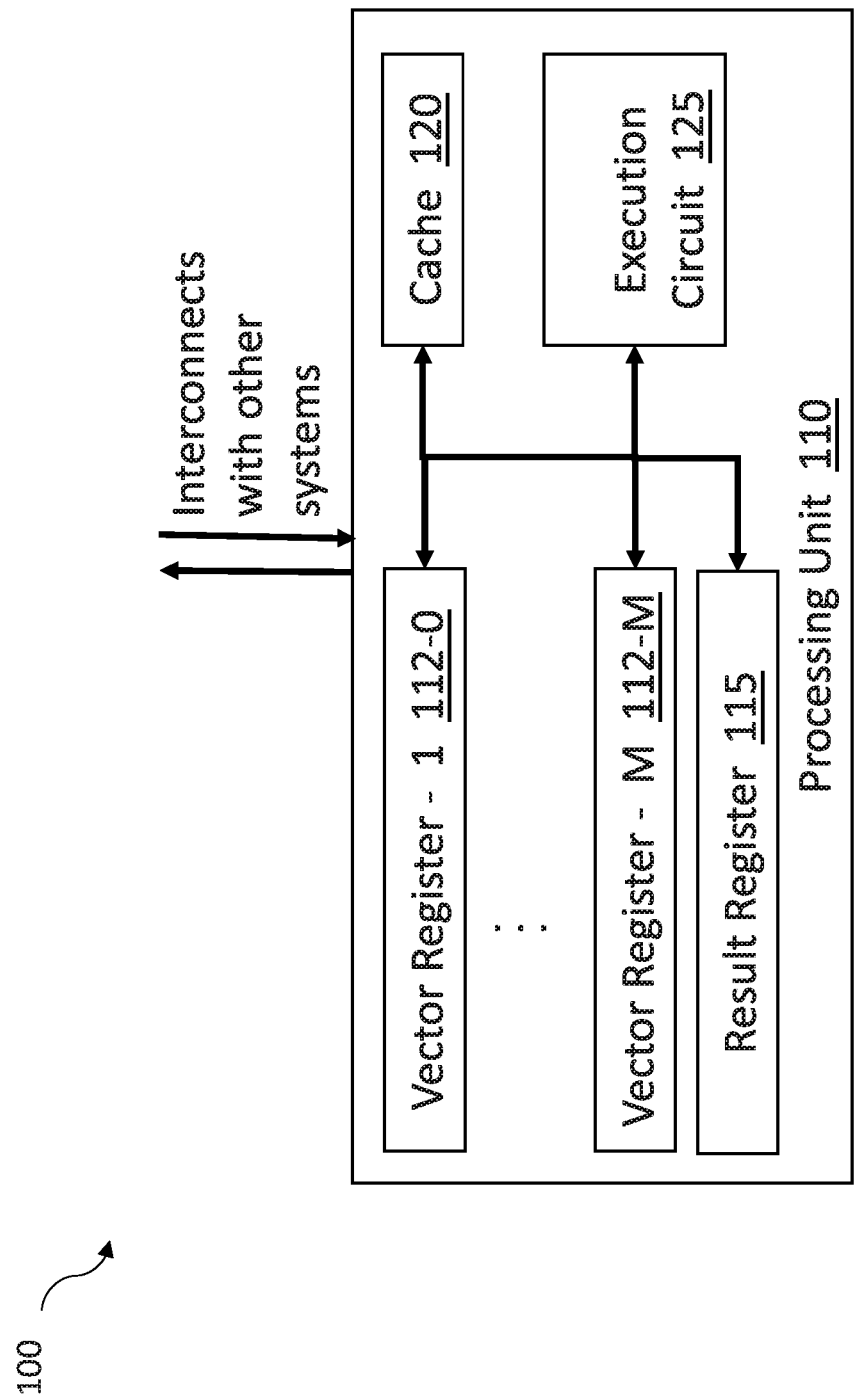
FIG. 1 is an illustration of a block diagram of an example processing system implementing a lookup table (LUT) operation.

Single instruction multiple data (SIMD) processors can have lookup table (LUT), i.e., permute, capability for when a LUT can fit into one SIMD set of registers or a single register. The SIMD can be of various sizes, such as being capable of 64 or 128 computations at a time. The register can be of various sizes as well, such as being a bit size of a power of 2, e.g., 16, 32, 64, 128, 256 bits. When a LUT fits within the SIMD set of registers or a single register, an ordinary selection process can be used to fetch the requested LUT indexed return value. If the LUT is larger in size than can be stored in a single register or a set of registers in a SIMD, then additional operations are needed to process the lookup across all portions of the LUT.

In order to enable the additional operations to check a larger LUT, extensions to the instruction language can be provided to enable this functionality. Many of these extensions may not be implemented efficiently, thereby increasing the computational cost of each lookup operation. For example, the ARM NEON SIMD extension requires that the index be repeatedly modified to be able to use the index for each portion of the LUT that is loaded in the registers. This can double the number of compute cycles to execute. Other processors have permute instructions which can select the indexed return value while not having the ability to leave a result unchanged or set to another determined value when switching to another LUT portion. A lookup can be completed in one compute cycle only if the entire LUT can be referenced in the one cycle. For tables that require multiple lookups, each lookup can take several instructions to determine whether the permute result is the desired result. Additionally, other processors can include additional operational instructions to perform the LUT operation across multiple LUT portions. These additional operational instructions can be costly in terms of processor cycle times to complete the operation.

This disclosure demonstrates an instruction for a processor to implement a LUT that can be larger than the size of a register or larger than a set of registers within a processor, while having better performance, i.e., faster, lower processor cycle times, than existing solutions. The register can be a vector register, a general purpose register, or other types of registers. Typically, the disclosure can be implemented on a SIMD processor. This can be utilized, for example, in digital signal processing (DSP) systems, drive systems, audio systems, video systems, Wi-Fi, mobile, and other communication systems.

In other aspects, the disclosure can be implemented on a processor without SIMD or vector capabilities. A general processor, without SIMD capabilities, can combine multiple general purpose registers to form the equivalent of a vector register. For example, general purpose registers (GPR) r0 thru r15 can be loaded with a subset of LUT entries. r16 can be loaded with the index. When there is a segment match with r16 then the process can perform an index lookup into r0-r15 for the corresponding value. There can be multiple indices in multiple GPRs, for example, r16 and r17, which can be processed in parallel. When there are a large number of GPRs, this can be faster than the standard indexed load from a memory location. For example, a processor with 64 32-bit GPRs, or 32 64-bit GPRs, can utilize half the registers to hold a 128 entry by 8-bit data LUT. The segment match can differentiate which segment needs to be loaded in the registers for lookup.

In another aspect, memory-to-memory processor architectures can be utilized. For example, an address register might contain the address of a segment and can be loaded when executing the instruction. When a segment matches the index identification (ID) then the LUT segment can be read from memory.

The LUT can be split into portions or subsets, herein called segments. There can be one or more segments of the LUT. Each segment can be assigned an ID, i.e., segment ID. There can be one or more available registers in the processor. A segment can be loaded into one or more registers in a processor, i.e., a set of registers. If there are enough registers, more than one segment can be loaded at a time. The instruction can then use part of an index of a data value compared against the segment ID corresponding to the segment loaded in the set of registers to determine if the correct segment is being queried. If not, another segment in this or a different set of registers can be compared, without having to change or modify the index itself. The part of the index that is used in the comparison can be derived from decoding a subset of the bits of the index, where the subset is that part of the index encoded with the segment ID. In addition, another segment of the LUT can be swapped into the set of registers and the index comparison operation can be executed against this newly loaded segment, without having to modify the index itself. The instruction can then return a result. The result can be the indexed return value, a default value, leave the result register unchanged, or another value determined by the operation.

The instruction can also operate on multiple indices passed to the instruction, such as using a parallel processing system, a pipeline processing system, a sequential processing system, or a combination of these systems. There can be one or more indices being looked up in a single instruction call. There can be a return parameter indicating or representing the quantity of indices matching, such as some, none, or all. There can be a determined default value or a determined initialized value for the return value, in cases where an indexed match does not occur, for example, 0, 1, and 255. Alternatively, there can be the capability to leave the result register unmodified if an indexed match does not occur. The indexed return values can be returned separately or they can be combined and returned in a register containing one or more return values. For example, a return set from multiple indices can be returned separately {a}, {b}, {c}, or combined in a single return {a,b,c}. In addition, the instruction can be implemented to support a determined data size, for example, 8, 16, 64, 128, 256, and other bit wide data values.

Segments can be determined in various ways, for example, a LUT can be divided into even segments, it can be divided by loading the segments utilizing the size of one or more registers while the last segment may not be large enough to fully load the available registers, or the data values can be ordered in a sequence, pattern, or by anticipated likelihood of usage. Other segmentation schemes can be utilized as well. For example, a 10 element LUT can be divided several ways, see table 1.

TABLE 1

| Segmentation examples of a LUT | | | | | |
|---|---|---|---|---|---|
| Example 1 | | Example 2 | | Example 3 | |
| Segment 1 | Segment 2 | Segment 1 | Segment 2 | Segment 1 | Segment 2 |
| {0-4} | {5-9} | {0-7} | {8-9} | {0, 2, 4, 6, 8} | {1, 3, 5, 7, 9} |

In an alternative, the instruction can also include an exit condition to exit the instruction and return the results. The exit condition can be triggered on various states. For example, an exit state can be a match found for one, some, or all of the requested indices. This can prevent unnecessary LUT scanning, thereby improving overall execution time.

A typical structure of the index can be to split it into a register lane selection, an optional selection of LUT data registers, and a segment ID. This encoding can be one of various formats. For example, the lower ($\log_2 (L)$) bits of the index can select the register lane for the data value, where L is the number of data elements in the register. Optionally, there can be a middle ($\log_2 (M)$) bits of the index to select between multiple LUT registers in a set, where M can be up to the number of available registers in the set. The remaining upper bits can encode the segment ID. Some typical LUT configurations are shown in Table 2, where N is the number of data elements and S is the number of segments.

TABLE 2

| Configuration examples | | | |
|---|---|---|---|
| N | L | M | S |
| 256 | 256 | 1 | 1 |
| 256 | 64 | 1 | 4 |
| 1024 | 128 | 2 | 4 |
| 8192 | 512 | 4 | 4 |

Each index to be looked up can be compared to the segment ID of the segment loaded into the set of registers. If the segment ID part of the index matches the segment ID, then the index is in the range of the segment loaded in the set of registers being compared. The segment ID may be provided as part of the instruction. Alternatively, the segment ID can be stored separately, such as in another register, for example a vector or general register, in a cache, or a memory location.

The instruction can return results of the indices lookup. There are varying methods for implementing the return feature. In one alternative, the write select for the register lane that was matched can be enabled or disabled. The result register can be initialized to a default or initial value. If a match is made, then the result register can be updated with the data element from the LUT. In another alternative, an alternative result register can be utilized when there is not a match. The update can also be handled in several other ways, such as initializing the result to 0 and then execute a logical 'or' with the LUT result on a segment ID match, or initializing to 1 and then execute a logical 'and' with the LUT result on a segment ID match. Other alternatives and algorithms can be utilized to modify the result register. In this aspect, the result register can build up the results from looking up an index into multiple segments and return the result when the lookup instruction(s) has completed.

The instruction functionality can be implemented in various ways. The algorithm can be implemented as logic in a processor, hardware instructions encoded in a processor, assembly language, machine language within the processor being used, and in a higher level language, such as C. Listing 1 is a pseudocode algorithm written in the C language. By example, listing 1 utilizes vector registers vZ, vW, vX, and vY with N lanes of data. The iterator i is used to access each N value. In C, the vector registers can be represented by an array. Given an 8 bit index to 8 bit data:

vZ[i] is the result data.
vW[i] is the data to write if there is no segment ID match. In another aspect, the register vW and vZ can be the same register where the result is only modified when there is a segment ID match, and the register is initialized to a determined value.
vX[i] is the values of one of the segments of the LUT.
vY[i] is the indices to lookup in the LUT.
IMM4 is the LUT segment ID that the data in vX corresponds to. In this example, there could be up to 16 different segments which are selected by the 4-bit value IMM4.

Listing 1: C language algorithm example
for (0<=i<128) {
seg_mask=0x0080;
if ((vY[i] & seg_mask)==((IMM4<<7) & seg_mask))
   {vZ[i]=vX[vY[i] & 0x007f];
}
else {
   vZ[i]=vW[i];
}
}

If a different data value width is selected to be used or if the bit width of the index is modified, then the algorithm can be modified to suit the changes. For example, the for loop counter, seg_mask, bit shift, and the bit 'and' mask, can be modified to accommodate the changes in the index bit width, the segmentation size, and the data value bit width. Other schemes can also be utilized with corresponding changes to the example instruction.

A vector processor can implement the above C code example utilizing the processor's instructions and constructs, such as with a single assembly language instruction. For example, a 512-bit wide SIMD instruction can be created to lookup 64 8-bit values in a 64 entry 8-bit lookup table. The instruction can be executed twice to lookup 64 values in a 128 entry lookup table.

Listing 2 Assembly language representation of a LUT algorithm

| | | |
|---|---|---|
| vld | v0, a4, 0 | //Load LUT entries 0-63 |
| vld | v1, a4, 1 | //Load LUT entries 64-127 |
| vld | v2, a5, 0 | //Load 64 indices to LUT |
| vlut8i8d | v3, v3, v0, v2, 0 | // Look into segment 0 |
| vlut8i8d | v3, v3, v1, v2, 1 | // Look into segment 1 |

Listing 2 can be generalized for using an instruction of varying numbers of segments, vector register widths, and the number of registers in a set. For example, the instruction sequence can be represented by the following outline. The table size is defined as S×M×L. Each operation can select from one or more registers at a time, overwriting a result value when a segment ID matches an index. If all indices will map into the LUT then the initial value of the result register is a "don't care" value, represented by X. Alternatively, the result register can be initialized to a value X that will be unchanged for indices outside the range of the LUT. X can be 0, 1, 255, and other determined values.

TABLE 3

Result register example

| | | | | | |
|---|---|---|---|---|---|
| X | X | ... | X | X | X |

The next step can be to set up the source register with the input indices that will be used to look up in the LUT.

TABLE 4

Input indices register example

| | | | | | |
|---|---|---|---|---|---|
| (M + 2) * L - 2 | S * M * L | ... | M * L | L + 1 | S * M * L - 2 |

The vector registers can be loaded with a segment of the LUT. For this example, there are more than 2 segments and more than 2 registers per segment.

TABLE 5

Segment 0 loaded into the available vector registers

| | | | | | | |
|---|---|---|---|---|---|---|
| Register 0 | L - 1 | L - 2 | ... | 2 | 1 | 0 |
| Register 1 | (2 * L) - 1 | (2 * L) - 2 | ... | L + 2 | L + 1 | L |
| ... | | | ... | | | |
| Register M - 1 | (M * L) - 1 | (M * L) - 2 | ... | ((M - 1) * L) + 2 | ((M - 1) * L) + 1 | (M - 1) * L |

After executing the instruction on segment 0, the result register is updated when the index matches the segment ID.

TABLE 6

Result register after a match made in segment 0

| | | | | | |
|---|---|---|---|---|---|
| X | X | ... | X | Value at L +1 | X |

The vector registers can be loaded, i.e., swapped, with a second segment of the LUT. Alternatively, a different set of registers can be used for the second segment.

TABLE 7

Segment 1 loaded into the available registers

| Register 0 | ((M + 1) * L) − 1 | ((M + 1) * L) − 2 | ... | (M * L) + 2 | (M * L) + 1 | M * L |
|---|---|---|---|---|---|---|
| Register 1 | ((M + 2) * L) − 1 | ((M + 2) * L) − 2 | ... | ((M + 1) * L) + 2 | ((M + 1) * L) + 1 | (M + 1) * L |
| ... | | | | | | |
| Register M − 1 | (2 * M * L) − 1 | (2 * M * L) − 2 | ... | (((2 * M) − 1) * L) + 2 | (((2 * M) − 1) * L) + 2 | ((2 * M) − 1) * L |

After executing the instruction on segment 1, the result register is updated when the index matches the segment ID.

TABLE 8

Result register after a match made in segment 1

| Value at (M + 2) * L − 2 | X | ... | Value at M * L | Value at L + 1 | X |
|---|---|---|---|---|---|

The registers can be loaded, i.e., swapped, with subsequent segments of the LUT. The final segment S-1 is loaded.

TABLE 9

Segment S −1 loaded into the available registers

| Register 0 | ((S − 1) * M * L) + L − | ((S − 1) * M * L) + L − 2 | ... | ((S − 1) * M * L) + 2 | ((S − 1) * M * L) +1 | (S − 1) * M * L |
|---|---|---|---|---|---|---|
| Register 1 | ((S − 1)* M * L) + (2*L) − 1 | ((S −1) * M * L) + (2 * L) − 2 | ... | ((S − 1)* M * L) + 2 | ((S −1)* M * L) + L 1 | ((S − 1) * M * L) + L |
| ... | | | | | | |
| Register M − 1 | (S * M * L) − 1 | (S * M * L) − 2 | ... | (S * M * L) − L + 2 | (S * M * L) − L + 1 | (S * M * L) − L |

After executing the instruction on segment S-1, the result register is updated when the index matches the segment ID.

TABLE 10

Result register after a match made in segment S-1

| Value at ((M + 2) * L) − 2 | X | ... | Value at M * L | Value at L + 1 | Value at (S * M * L) − 2 |
|---|---|---|---|---|---|

The result register, as demonstrated in table 10, is then used as the result of the instruction. It demonstrates that there were 4 matched indices and 1 unmatched index, which remains at the initial value of X.

This is an example of the instruction sequence that can be implemented.

Instruction sequences can vary, such as loading the source index register first and then initializing the result register. Alternatively, the segments can be loaded using a different sequence then demonstrated. Various optimization algorithms can be applied to the segment loading. The index does not change when using different sequences or loading different segments. The index can remain the same throughout the process, thereby saving clock cycles and simplifying the instruction execution.

Turning now to the figures, FIG. 1 is an illustration of a block diagram of an example processing system 100 of a LUT operation. Processing system 100 includes a processing unit 110, which, for this example, includes vector registers. Processing unit 110 includes one or more vector registers 112-0 to 112-M, where M is the number of available vector registers, a result register 115, a cache memory 120, and execution circuit 125. Processing system 100 can be a SIMD, a vector processor, or a part of such a processor.

Through the interconnects with other systems, which can be other portions of the processing unit 110 and other computing systems, the processing unit can receive a LUT table, and store it in the cache 120 memory area. The LUT can be loaded into the one or more vector registers 112. If the LUT is larger than can fit into the available vector registers, then the LUT can be segmented and then selected segments can be loaded into the available vector registers 112. Execution circuit 125 can execute one or more instructions to perform a lookup in the LUT. The values to lookup in the LUT can be passed in to the execution circuit as parameters, stored in a register, stored in a cache, stored in a memory location, and stored in other accessible locations.

The execution circuit 125 can initialize the result register 115 with the determined default or initial value. The execution circuit 125 can perform the comparison between the indices and the segment ID for the segment loaded into the vector registers 112 to determine if a match is available. If a match is available, then the lookup value at the indexed location can be retrieved and stored in the result register 115, replacing or overriding the initial value for that index in the result register. Once the completion criteria is reached, where such criteria can be an exit on finding one, some, or all of the lookup values, or that all indices have been attempted to be looked up, the execution circuit 125 can exit the instruction. The result register 115 can contain the results of the instruction execution.

FIG. 2A is an illustration of a diagram of an example vector register scheme 200 of a LUT. Vector register scheme 200 can comprise vector register lanes 210 and vector registers 215. The vector register design in the SIMD can determine the number of vector lanes available to store LUT entries. The vector register lanes are labeled 210-1 through 210-L, where L is the number of available lanes. The vector register design in the SIMD can also determine the number of available vector registers to store the LUT. The vector registers are labeled 215-1 through 215-M, where M is the number of vector registers available to be used.

FIG. 2B is an illustration of a diagram 220 of an example segmenting of a LUT. A LUT 225 can be of a size that can be divided into one or more segments 226. The number of segments is determined from the size of the available vector lanes (see FIG. 2A, value L), the number of available vector registers (see FIG. 2A, value M), the size of the LUT, and the algorithm used to divide the LUT. The segments are labeled as 226-1 through 226-S, where S is the number of segments determined for the LUT. The algorithm used to divide the LUT can be, for example, based on ordered values, a modulus of a certain value, an anticipated likelihood of use, frequency of use, and other algorithms.

FIG. 3 is an illustration of a table demonstrating an example LUT segmentation 300. LUT segmentation 300 contains a first column 305 which indicates a linear ID for each LUT entry. The number of entries is represented by N. Column 310 indicates a segment ID where the number of segments is S. Column 315 indicates a vector register, numbered for clarity, where the number of available vector registers is M. Column 320 indicates the vector register lanes, i.e., data value storage location, for a value within the LUT. The number of available lanes is L. Column 325 indicates the mapping of the segment, register, and lane to the LUT entry. As segments are swapped into the vector registers, the index remains the same, and the segment ID to match is modified instead.

Figure 4:
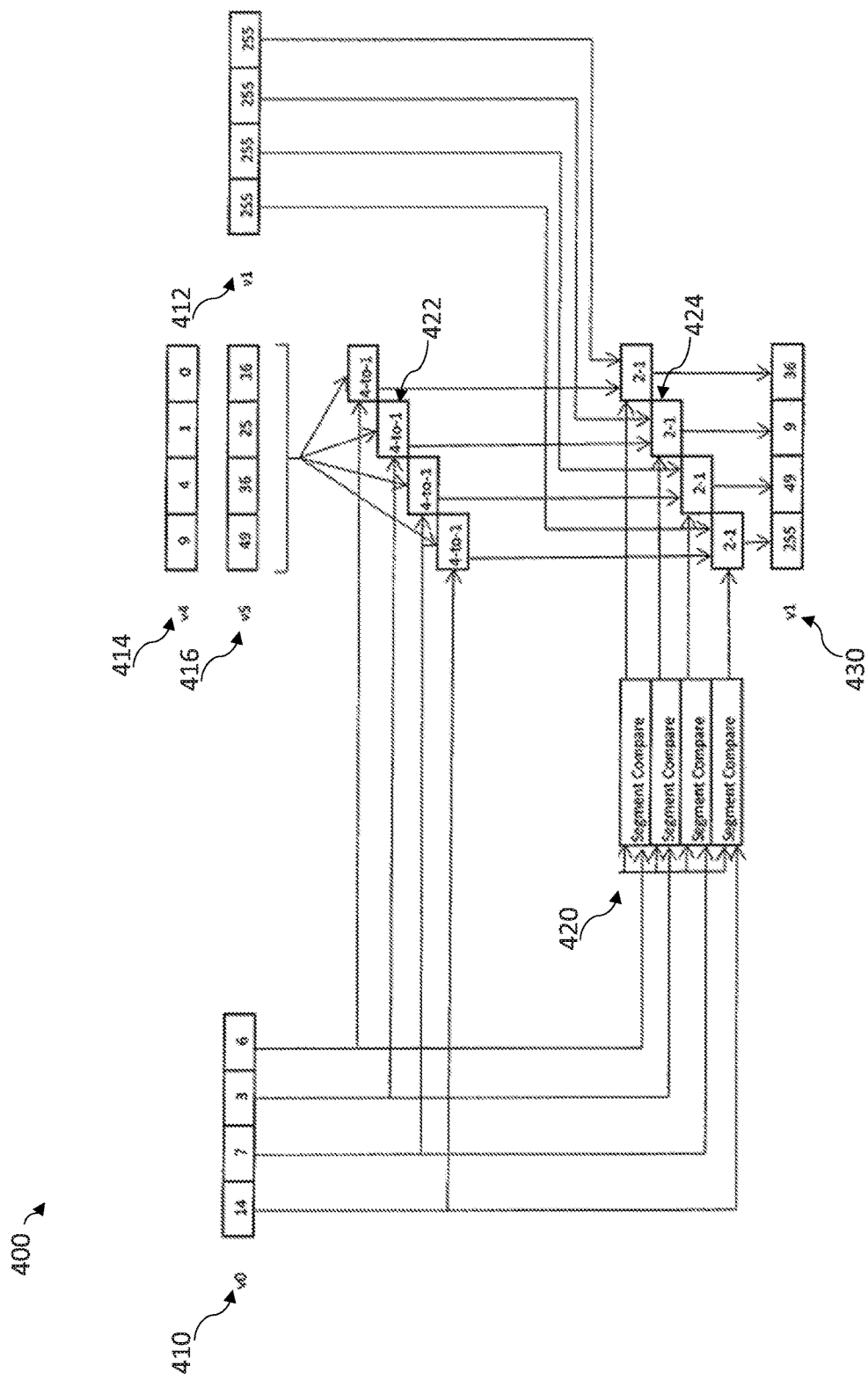
FIG. 4 is an illustration of a diagram of an example process flow of a LUT indexed operation.

FIG. 4 is an illustration of a drawing of an example flow diagram of a LUT instruction flow 400. Flow 400 demonstrates how the indices can be used to find a value in the LUT. Flow 400 comprises an index register 410, a default register 412, a result register 430, two available vector registers 414 and 416, and three operational steps 420, 422, and 424. The example illustrates 8-bit indices into an 8-entry LUT using 4 vector lanes and 2 segments.

LUT instruction flow 400 can have an input parameter indices which are stored in register v0 410. A result register v1 412 can be initialized with a value to use when there is not a segment match, in this example, to a value of 255. One or more segments can be loaded into available vector registers. In this example, two vector registers v4 414 and v5 416 each hold one segment, a parallel operation is occurring where all four LUT values are retrieved from the selected vector register using the parallel processing constructs of the processing unit. This example requires two operations: one operation to check for a segment match to use v4 414 and another to check for a segment match to use v5 416. Other examples could have multiple segment ID registers for multiple segments in parallel. The LUT lookup values are retrieved from the vector registers at operation 422, where the two least significant bits of each index are used to select a value from the vector register. A segment compare operation is executed at 420. If there is a match between the segment ID and the 6 most significant bits of the index, then operation 424 will use the LUT result from operation 422 rather than the value retrieved from v1 412 and store the result in result vector v1 430. The segment ID may come from a register, the instruction, or another location. The order of the operational instructions can vary from the example provided. For example, the segment ID comparison operation 420 can be executed prior to indexed values being retrieved from the vector registers in operational step 422. This can occur, for example, if the segment ID for what is loaded in the vector registers is stored in a reference location. Data retrieval from the vector register would occur upon a segment ID match, and not for all indices regardless of the segment ID match.

In this example, first the index 6 in v0 410 is looked up in the vector register v4 414. Using the two least significant bits, the LUT value of 4 is retrieved. The upper six bits of the index 6 is binary 000001 which is not equal to the segment ID of 0, therefore the value of 255 from v1 412 is put into the result register v1 v30. Secondly, the index 6 in v0 410 is looked up in the vector register v5 416 by its two least significant bits and the LUT value 36 is retrieved. The upper six bits of the index 6 is binary 000001 which is equal to the segment ID of 1 so the value 36 from operational step 422 is stored in the result vector v1 430 in the same position as the index 6 in the input register. Index 14 from v0 410 was not found to match the currently loaded segments in the vector registers. That is represented by the 255 value in the result register v1 430.

Figure 5:
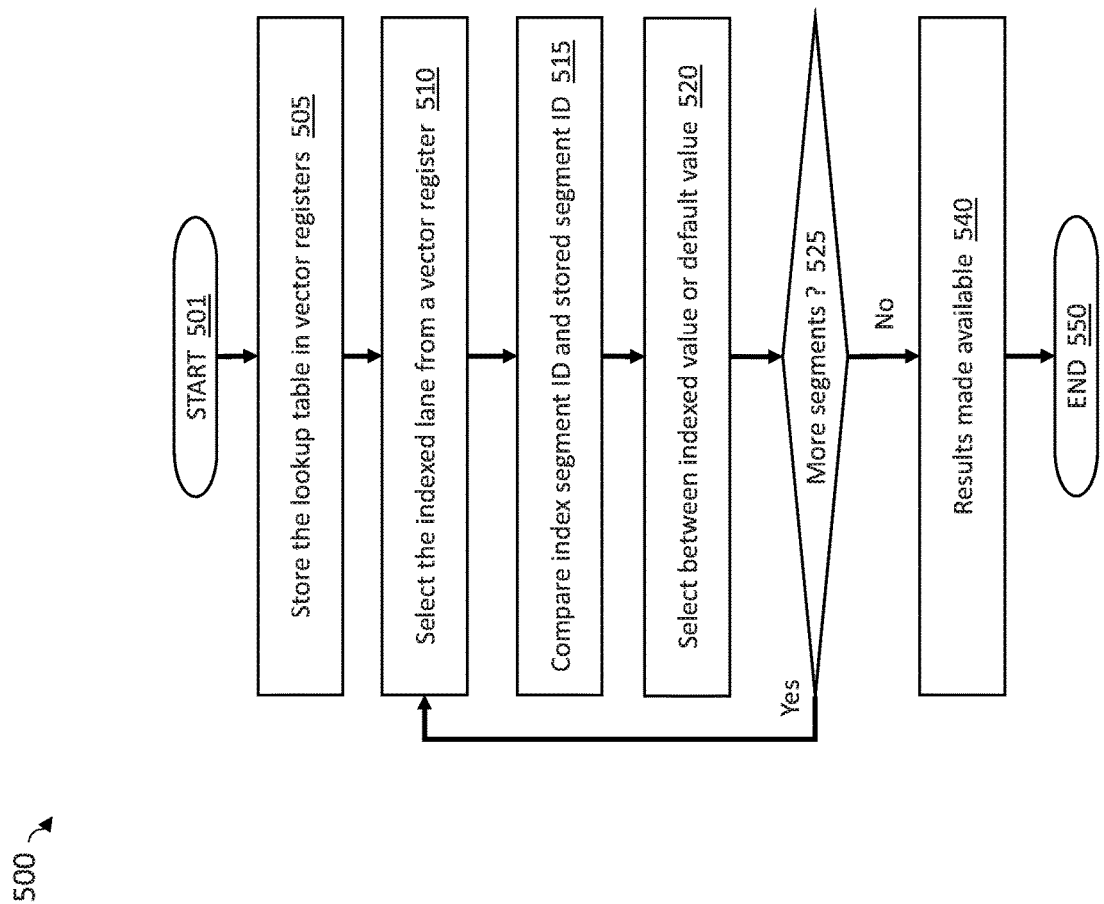
FIG. 5 is an illustration of a flow diagram of an example method for a LUT indexed operation.

FIG. 5 is an illustration of a block diagram of an example method 500 for a lookup table operation. The method begins at a step 501 and proceeds to a step 505. At the step 505, the LUT segments are stored, or a subset of the segments are stored in one or more available vector registers, with each vector register corresponding to a segment of the table. Proceeding to a step 510, an index is used to select the lane from one of the vector registers. Proceeding to a step 515, an index, which has the segment ID encoded in it, is compared against the segment ID of the subset of the LUT that is currently loaded in the vector register. Proceeding to a step 520, if a match is found in step 515, then the indexed value in the LUT is made available to other operational steps or instructions, or is returned as a parameter. If a match is not found, the default value can be made available or the result can be left unmodified.

Proceeding to decision step 525, if the LUT requires more than one segment to be searched, i.e., the 'Yes' path, then the steps 510-520 can be repeated utilizing another segment of the LUT in another vector register or another segment of the LUT swapped into the same vector register. By using the result register as the default value for the next segment lookup, the result can accumulate all the lookups from multiple segments. If decision step 525 results in the 'No' path, then the method proceeds to a step 540. In the step 540, the accumulated result set is returned or is otherwise made available to other processes. The method ends at a step 550.

Figure 6:
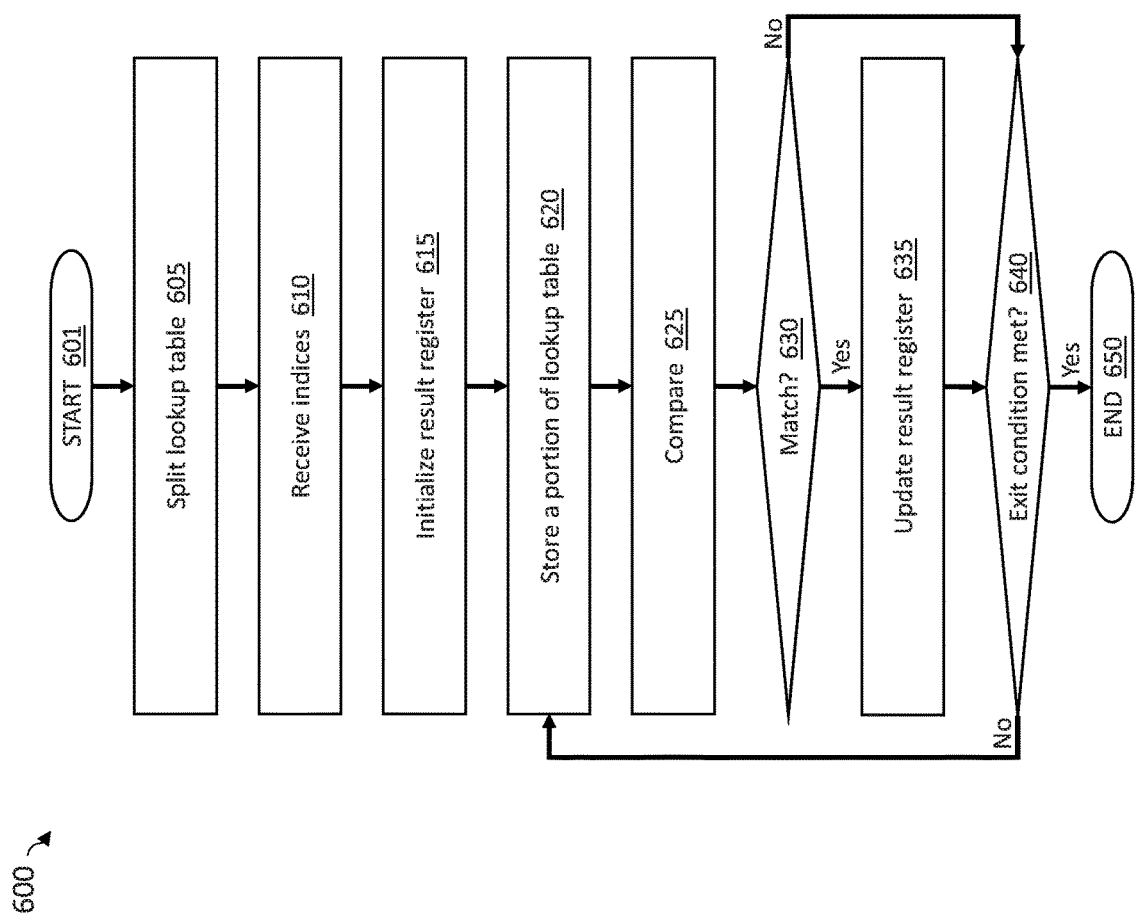
FIG. 6 is an illustration of a flow diagram of an example method, building on FIG. 5.

FIG. 6 is an illustration of a block diagram of an example method 600, expanding on FIG. 5. Method 600 starts at a step 601 and proceeds to a step 605. In the step 605, the LUT is split into segments using an algorithm, such as sequentially, frequently used values, and other algorithms. In a step 610, the system receives indices to lookup in the LUT. If there is more than one index received, the system can execute the remaining steps in parallel, pipeline, or sequential processing. In a step 615, a result can be initialized to a default or initial value, such as 0, 1, or 255. Steps 605, 610, and 615 can be executed in any order or in parallel. These steps are not dependent on each other. In a step 620, a subset of the LUT is stored in the vector registers. The subset stored can be all of the LUT or one or more segments of the LUT. This is dependent on the size of the LUT, the number of registers, and the algorithm used to split the LUT.

Proceeding to a step 625, the segment ID extracted from the received index from step 610 is compared against the segment ID of the subsets of the LUT stored in the vector registers. The segment ID of the subsets of the LUT can be stored in a general purpose, or special purpose register, a memory location, part of the instruction, or another location that can be referenced by the operating instruction. Proceeding to a decision step 630, the instruction determines if a match occurs on the segment ID.

If a match occurs, then the 'Yes' path is followed to a step 635. In a step 635, the result register is updated with the indexed lane from the segment that matched, using an algorithm. For example, writing the complete value, using an 'or' operation if the initial value was set to zero, or an 'and' operation if the initial value was set to one. Other algorithms can also be utilized. The method 600 proceeds to a decision step 640.

If a match does not occur, the 'NO' path is followed to the decision step 640. Decision step 640 determines if an exit condition has been met. For example, a match of one, some, or all of the indices has been made, or all of the segments of the LUT have been examined and no match was found for the remaining indices. If an exit condition is not met, then the method 600 returns to step 620 to load the next subset of the LUT, which can be one or more segments, into the vector registers. If an exit condition is met, then the method 600 proceeds to a step 650 and ends. The result register, if utilized, would comprise the retrieved LUT values as indicated by the received indices. The result register can then be utilized by other operations and instructions.

In interpreting the disclosure, all terms should be interpreted in the broadest possible manner consistent with the context. In particular, the terms "comprises" and "comprising" should be interpreted as referring to elements, components, or steps in a non-exclusive manner, indicating that the referenced elements, components, or steps may be present, or utilized, or combined with other elements, components, or steps that are not expressly referenced.

A portion of the above-described apparatus, systems or methods may be embodied in or performed by various digital data processors or computers, wherein the computers are programmed or store executable programs of sequences of software instructions to perform one or more of the steps of the methods. The software instructions of such programs may represent algorithms and be encoded in machine-executable form on non-transitory digital data storage media, e.g., magnetic or optical disks, random-access memory (RAM), magnetic hard disks, flash memories, and/or read-only memory (ROM), to enable various types of digital data processors or computers to perform one, multiple or all of the steps of one or more of the above-described methods, or functions, systems or apparatuses described herein.

Portions of disclosed embodiments may relate to computer storage products with a non-transitory computer-readable medium that have program code thereon for performing various computer-implemented operations that embody a part of an apparatus, device or carry out the steps of a method set forth herein. Non-transitory used herein refers to all computer-readable media except for transitory, propagating signals. Examples of non-transitory computer-readable media include, but are not limited to: magnetic media such as hard disks, floppy disks, and magnetic tape; optical media such as CD-ROM disks; magneto-optical media such as floptical disks; and hardware devices that are specially configured to store and execute program code, such as ROM and RAM devices. Examples of program code include both machine code, such as produced by a compiler, and files containing higher level code that may be executed by the computer using an interpreter.

Those skilled in the art to which this application relates will appreciate that other and further additions, deletions, substitutions and modifications may be made to the described embodiments. It is also to be understood that the terminology used herein is for the purpose of describing particular embodiments only, and is not intended to be limiting, since the scope of the present disclosure will be limited only by the claims. Unless defined otherwise, all technical and scientific terms used herein have the same meaning as commonly understood by one of ordinary skill in the art to which this disclosure belongs. Although any methods and materials similar or equivalent to those described herein can also be used in the practice or testing of the present disclosure, a limited number of the exemplary methods and materials are described herein.

It is noted that as used herein and in the appended claims, the singular forms "a", "an", and "the" include plural referents unless the context clearly dictates otherwise.

What is claimed is:

1. A method to utilize a lookup table (LUT) in a processor, comprising:
    splitting said LUT into more than one segment, wherein said LUT is larger than a register of said processor;
    storing a subset of said segments in a set of said registers, wherein there exists a greater quantity of said segments than a quantity of said registers in said set;
    comparing an index of a data value and a LUT segment identification (ID) of each of said segments, wherein a subset of bits from said index are decoded to compare with said LUT segment ID; and
    returning a result, utilizing said comparing.

2. The method as recited in claim 1, wherein a subset of said segments are swapped into said registers during said comparing.

3. The method as recited in claim 1, further comprising:
    evaluating an exit condition, and exiting said comparing, wherein said subset of bits from said index match said LUT segment ID.

4. The method as recited in claim 1, wherein a second subset of bits from said index are decoded for a register select ID and a third subset of bits from said index are decoded for a register lane select ID.

5. The method as recited in claim 1, wherein said comparing returns a parameter representing a quantity of indices matching said LUT segment ID.

6. The method as recited in claim 1, wherein said comparing returns an indexed return value.

7. The method as recited in claim 6, wherein said result is initialized to a determined value prior to said comparing, and said returning combines said determined value and said indexed return value.

8. The method as recited in claim 6, wherein said result is a default value from another register, when said index does not match the LUT segment ID.

9. The method as recited in claim 6, wherein said returning enables or disables a write select when decoded said subset of bits from said index, and said LUT segment ID match.

10. The method as recited in claim 1, wherein more than one index is utilized, and said comparing utilizes at least one of a parallel process, a pipeline process, and a sequential process.

11. The method as recited in claim 10, wherein said returning utilizes a result register to store said result from each of said indices.

12. The method as recited in claim 1, wherein said splitting, storing comparing, and returning are implemented as one or more processor instructions.

13. The method as recited in claim 1, wherein said LUT segment ID is a parameter to said comparing.

14. The method as recited in claim 1, wherein said LUT segment ID is referenced in a register.

15. The method as recited in claim 1, wherein said set of said registers are vector registers, general purpose registers, or memory.

16. A computer program product having a series of operating instructions stored on a non-transitory computer-readable medium that directs a data processing apparatus when executed thereby to perform operations utilizing a lookup table (LUT), comprising:
    splitting said LUT into more than one segment, wherein said LUT is larger than a register of a processor;

storing a subset of said segments in a set of said registers;

comparing a decoded subset of bits of an index of a data value and a LUT segment identification (ID) of each of said segments, wherein said comparing returns an indexed return value and said index is encoded with one or more of register lanes, register ID, and segment ID; and returning a result, utilizing said comparing.

17. The computer program product as recited in claim 16, further comprising:

stopping said comparing where said index encoded segment ID matches said LUT segment ID.

18. The computer program product as recited in claim 16, wherein said result is initialized to a determined value prior to said comparing, and said returning combines said determined value and said indexed return value.

19. The computer program product as recited in claim 16, wherein said LUT segment ID is an instruction parameter or referenced in a register, not part of said set of said registers.

20. A lookup table (LUT) processing system to perform a LUT operation on a single instruction multiple data (SIMD) processor, comprising:

a set of vector registers, each operable to store a subset of said LUT;

a memory, operable to store one or more instructions, said LUT, a segment identification (ID), one or more indices, and instruction parameters; and an execution circuit, operable to execute a set of LUT operation instructions, wherein said instructions load a subset of said LUT segments from said memory into said set of registers, compare a decoded subset of bits from an index of a data value to a LUT segment ID of said loaded subset of said LUT segments, and return an indexed return value utilizing said compare.

21. The processing system as recited in claim 20, wherein said index encodes a lane ID and a register ID.

22. The processing system as recited in claim 20, wherein said execution circuit is operable to perform more than one said compare in at least one of a parallel process, a pipeline process, and a sequential process.

23. The processing system as recited in claim 20, further comprising:

a result register, operable to store an initial value and said indexed return value.

24. The processing system as recited in claim 20, further comprising:

a register, operable to store said segment ID.

25. A method to utilize a lookup table (LUT) in a computing system, comprising:

splitting said LUT into more than one segment, wherein said LUT is larger than a memory access size of a processor of said computing system;

comparing a decoded subset of bits of an index of a data value and a LUT segment identification (ID) of each of said segments; and returning a result, utilizing said comparing, wherein said result is an indexed return value.

* * * * *